US012119933B2

(12) United States Patent
Liu et al.

(10) Patent No.: US 12,119,933 B2
(45) Date of Patent: Oct. 15, 2024

(54) COMMUNICATION METHOD AND APPARATUS UTILIZING POLAR ENCODING AND DECODING BASED ON CHANNEL CAPACITY

(71) Applicant: Huawei Technologies Co., Ltd., Shenzhen (CN)

(72) Inventors: Ling Liu, Shenzhen (CN); Bin Li, Shenzhen (CN); Jiaqi Gu, Shenzhen (CN); Hui Shen, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 204 days.

(21) Appl. No.: 17/556,756

(22) Filed: Dec. 20, 2021

(65) Prior Publication Data

US 2022/0116141 A1 Apr. 14, 2022

Related U.S. Application Data

(63) Continuation of application No. PCT/CN2020/097291, filed on Jun. 20, 2020.

(30) Foreign Application Priority Data

Jun. 21, 2019 (CN) .......................... 201910540213.6

(51) Int. Cl.
*H04L 1/00* (2006.01)
*H03M 13/00* (2006.01)
*H03M 13/13* (2006.01)

(52) U.S. Cl.
CPC .......... *H04L 1/0057* (2013.01); *H03M 13/13* (2013.01); *H04L 1/0041* (2013.01); *H04L 1/0045* (2013.01)

(58) Field of Classification Search
CPC ... H04L 1/0057; H04L 1/0041; H04L 1/0045; H03M 13/13
See application file for complete search history.

(56) References Cited

U.S. PATENT DOCUMENTS

| 8,656,248 B2* | 2/2014 | Palanki ................. H04L 1/0057 714/701 |
| 10,944,511 B2* | 3/2021 | Hui ....................... H03M 13/13 |
| 11,039,425 B2* | 6/2021 | Lin ........................ H04L 5/001 |
| 11,601,217 B2* | 3/2023 | Xu ........................ H03M 13/13 |

(Continued)

FOREIGN PATENT DOCUMENTS

| CN | 104079370 A | 10/2014 |
| CN | 108347302 A | 7/2018 |

(Continued)

*Primary Examiner* — Justin R Knapp
(74) *Attorney, Agent, or Firm* — Leydig, Voit & Mayer, Ltd.

(57) ABSTRACT

Embodiments of the present disclosure disclose obtaining to-be-encoded first information that includes first and second information bit sets. The bits included in the first information bit set are obtained through decoding by a plurality of terminal devices. The bits included in the second information bit set are able to be obtained through decoding by some of the plurality of terminal devices. Polar encoding is first performed on the first information bit set to obtain first encoded information. Polar encoding is then performed on the second information bit set based on the first encoded information to obtain second encoded information.

20 Claims, 9 Drawing Sheets

(56) References Cited

U.S. PATENT DOCUMENTS

2019/0028119 A1    1/2019  Yang et al.
2019/0074928 A1    3/2019  Ma et al.
2023/0336270 A1*  10/2023  Xu .................... H04L 1/0057
                                                                              370/216

FOREIGN PATENT DOCUMENTS

| CN | 108429599 A | 8/2018 |
| CN | 108649965 A | 10/2018 |
| CN | 108737020 A | 11/2018 |
| CN | 109067406 A | 12/2018 |
| CN | 109327226 A | 2/2019 |

* cited by examiner

COMMUNICATION METHOD AND APPARATUS UTILIZING POLAR ENCODING AND DECODING BASED ON CHANNEL CAPACITY

CROSS-REFERENCE TO RELATED APPLICATIONS

This application is a continuation of International Patent Application No. PCT/CN2020/097291, filed on Jun. 20, 2020, which claims priority to Chinese Patent Application No. 201910540213.6, filed on Jun. 21, 2019. The disclosures of the aforementioned applications are hereby incorporated by reference in their entireties.

TECHNICAL FIELD

Embodiments of the present disclosure relate to the field of communication technologies, and in particular, to a communication method and apparatus.

BACKGROUND

A polar code is a first channel code that can be theoretically proved to approximate a Shannon channel capacity, and therefore is widely used in communication technologies. In a broadcast system, one network device needs to simultaneously communicate with a plurality of terminal devices. In this way, a "Cannikin Law" method is used in the industry, to ensure that the network device simultaneously communicates with the plurality of terminal devices. To be specific, the network device designs a polar coding scheme only based on a terminal device having a poorest channel condition (which is a terminal device having a smallest channel capacity). A channel with a larger channel capacity cannot be fully used because the polar coding scheme is designed based on the smallest channel capacity in the foregoing method. This results in a waste of resources.

SUMMARY

Embodiments of the present disclosure disclose a communication method and apparatus, to save resources.

A first aspect discloses a communication method, including: obtaining to-be-encoded first information that includes a first information bit set and a second information bit set, performing first polar encoding on the first information bit set to obtain first encoded information, performing second polar encoding on the second information bit set based on the first encoded information to obtain second encoded information, and outputting the second encoded information. Bits included in the first information bit set can be obtained through correct decoding by a plurality of terminal devices, and bits included in the second information bit set can be obtained through correct decoding by some of the plurality of terminal devices. It can be learned that superposition encoding may be implemented on a plurality of pieces of information by performing polar encoding for a plurality of times. In this case, a terminal device having a small channel capacity can perform decoding to obtain some of the information, and a terminal device having a large channel capacity can perform decoding to obtain all of the information, so that channel capacities of the different terminal devices are properly used. Therefore, resources can be saved.

In a possible implementation, that bits included in the first information bit set can be obtained through correct decoding by a plurality of terminal devices may include: $K_1/N$ is less than $C_1$ or $K_1/N$ is equal to $C_1$, $K_1$ is a quantity of the bits included in the first information bit set, N is a mother code length, $C_1$ is a capacity of a first constructed channel, and the first constructed channel is a channel between the first encoded information and a terminal device having a smallest channel capacity in the plurality of terminal devices. That bits included in the second information bit set can be obtained through correct decoding by some of the plurality of terminal devices includes: $K_2/N$ is less than $C_2$ or $K_2/N$ is equal to $C_2$, $K_2$ is a quantity of the bits included in the second information bit set, $C_2$ is a difference between a capacity of a second constructed channel and a capacity of a third constructed channel, the second constructed channel is a channel among the first encoded information, the second encoded information, and a terminal device having a largest channel capacity in the plurality of terminal devices, and the third constructed channel is a channel between the first encoded information and the second encoded information.

In a possible implementation, the first information bit set may include necessary information in the first information, and the second information bit set may include unnecessary information in the first information.

In a possible implementation, first polar encoding may be performed on the first information bit set and a first fixed bit set to obtain the first encoded information. The first fixed bit set is a set of fixed bits of the terminal device having the smallest channel capacity in the plurality of terminal devices.

In a possible implementation, the first encoded information may be first compressed to obtain compressed information, and then second polar encoding is performed on the second information bit set and the compressed information to obtain the second encoded information.

In a possible implementation, the first encoded information is compressed based on a second fixed bit set and the second information bit set to obtain the compressed information. The second fixed bit set is a set of fixed bits of the terminal device having the largest channel capacity in the plurality of terminal devices.

In a possible implementation, second polar encoding may be performed on the second fixed bit set, the second information bit set, and the compressed information to obtain the second encoded information.

In a possible implementation, channel capacities of the plurality of terminal devices include two or more different channel capacities.

In a possible implementation, the capacity of the first constructed channel is $I(V; Y_1)$, V is the first encoded information, $Y_1$ is information that corresponds to the second encoded information and that is correctly received by the terminal device having the smallest channel capacity in the plurality of terminal devices, and $I(V; Y_1)$ is mutual information between V and Yr. The capacity of the second constructed channel is $I(X; V, Y_2)$, X is the second encoded information, $Y_2$ is information that corresponds to the second encoded information and that is correctly received by the terminal device having the largest channel capacity in the plurality of terminal devices, and $I(X; V, Y_2)$ is mutual information between X, and V and $Y_2$. The capacity of the third constructed channel is $I(X; V)$, and $I(X; V)$ is mutual information between X and V.

In a possible implementation, a channel capacity of a first terminal device is $I(X; Y)$, Y is information that corresponds to the second encoded information and that is correctly received by the first terminal device, and the first terminal device is any one of the plurality of terminal devices.

A second aspect discloses a communication method, including: receiving information from a network device; performing first polar decoding on the received information to obtain a first information bit set; and when it is determined that the received information can be decoded for more information, performing second polar decoding on the received information based on the first information bit set to obtain a second information bit set. Both the first information bit set and the second information bit set belong to first information. It can be learned that different terminal devices can perform decoding to obtain different information. In this case, a terminal device having a small channel capacity can perform decoding to obtain some information, and a terminal device having a large channel capacity can perform decoding to obtain all information, so that channel capacities of the different terminal devices are properly used. Therefore, resources can be saved.

In a possible implementation, polar encoding may be performed on the first information bit set to obtain first encoded information, and second polar decoding may be performed on the first encoded information and the received information to obtain the second information bit set.

In a possible implementation, polar encoding may be performed on the first information bit set and a first fixed bit set to obtain the first encoded information. The first fixed bit set is a set of fixed bits of a terminal device having a smallest channel capacity in a plurality of terminal devices. The plurality of terminal devices are terminal devices that can correctly perform decoding to obtain the first information bit set.

In a possible implementation, the first information bit set is a set of bits of necessary information in the first information, and the second information bit set is a set of bits of unnecessary information in the first information.

In a possible implementation, a capacity of a constructed channel between the first encoded information and the received information may be calculated. When the calculated capacity is greater than a capacity of a first constructed channel, it is determined that the received information can be decoded for more information. The first constructed channel is a channel between the first encoded information and the terminal device having the smallest channel capacity in the plurality of terminal devices.

In a possible implementation, channel capacities of the plurality of terminal devices may include two or more different channel capacities.

In a possible implementation, $I(V; Y_1)$ is calculated to obtain the capacity of the constructed channel between the first encoded information and the received information, where V is the first encoded information, $Y_1$ is the received information, and $I(V; Y_1)$ is mutual information between V and Yr. The capacity of the first constructed channel is $I(V; Y_2)$, $Y_2$ is information that is received by the terminal device having the smallest channel capacity in the plurality of terminal devices and that can be correctly decoded to obtain the first information bit set, and $I(V; Y_2)$ is mutual information between V and $Y_2$.

In a possible implementation, a channel capacity of a first terminal device is $I(X; Y)$, X is encoded information corresponding to the received information that is sent by the network device, Y is information that is received by the first terminal device and that can be correctly decoded to obtain the first information bit set, $I(V; Y)$ is mutual information between V and Y, and the first terminal device is any one of the plurality of terminal devices.

A third aspect discloses a communication apparatus. The communication apparatus includes modules configured to perform the communication method disclosed in any one of the first aspect or the embodiments of the first aspect, or includes modules configured to perform the communication method disclosed in any one of the second aspect or the embodiments of the second aspect.

A fourth aspect discloses a communication apparatus. The communication apparatus includes a processor, a memory, an input interface, and an output interface. The input interface is configured to receive information from another communication apparatus other than the communication apparatus, and the output interface is configured to output information to the another communication apparatus other than the communication apparatus. When the processor executes a computer program stored in the memory, the processor performs the communication method disclosed in any one of the first aspect or the possible implementations of the first aspect, or the processor performs the communication method disclosed in any one of the second aspect or the embodiments of the second aspect.

A fifth aspect discloses a computer-readable storage medium. The computer-readable storage medium stores a computer program. When the computer program runs, the communication method disclosed in any one of the first aspect or the embodiments of the first aspect is implemented, or the communication method disclosed in any one of the second aspect or the embodiments of the second aspect is implemented.

DESCRIPTION OF EMBODIMENTS

Embodiments of the present disclosure disclose a communication method and apparatus, to save resources. The following separately provides detailed descriptions.

Figure 1:
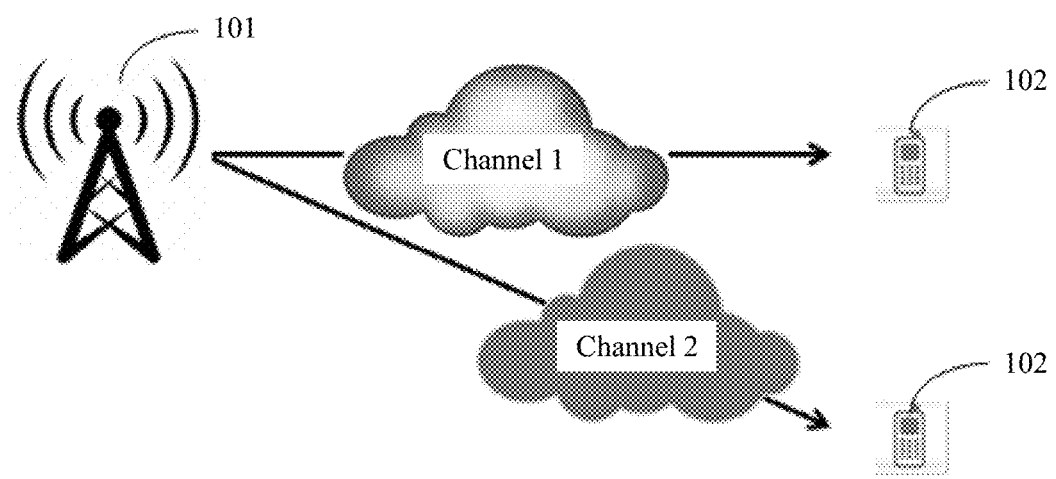
FIG. 1 is a schematic diagram of a network architecture according to an embodiment of the present disclosure.

To better understand the communication method and apparatus according to the embodiments of the present disclosure, the following first describes a network architecture used in the embodiments of the present disclosure. FIG. 1 is a schematic diagram of a network architecture according to an embodiment of the present disclosure. As shown in FIG. 1, the network architecture may include a network device 101 and a plurality of terminal devices 102 (two terminal devices are shown in FIG. 1). The network device 101 and the plurality of terminal devices 102 form a broadcast system. The terminal device 102 is configured to send an information obtaining request to the network device 101. The network device 101 is configured to: receive the information obtaining request from the terminal device 102, encode information requested by the information obtaining request, and broadcast encoded information to the terminal devices 102. The terminal device 102 is further configured to: receive the information from the network device 101, and decode the received information.

The network device 101 may be a device configured to communicate with the terminal devices 102. For example, the network device 101 may be a base transceiver station (BTS) in a global system for mobile communications (GSM) or a code-division multiple access (CDMA) system, may be a nodeB (NB) in a wideband code-division multiple access (WCDMA) system, may be an evolved NodeB (eNB or eNodeB) in a long term evolution (LTE) system, may be a terminal that functions as a network device in device-to-device (D2D) communication, may be a relay station, an access point, a vehicle-mounted device, a transmission point, a wearable device, a network side device in a 5G network, a network device in a future evolved public land mobile network (PLMN), or any device that functions as a network device.

The terminal device 102 may be user equipment (UE), an access terminal, a subscriber unit, a subscriber station, a mobile station, a remote station, a remote terminal, a mobile device, a user terminal, a wireless communication device, a user agent, or a user apparatus. The access terminal may be a cellular phone, a cordless phone, a session initiation protocol (SIP) phone, a wireless local loop (WLL) station, a personal digital assistant (PDA), a handheld device having a wireless communication function, a computing device or another processing device connected to a wireless modem, a vehicle-mounted device, a wearable device, a terminal in a 5G network, a terminal in a future evolved PLMN network, or the like.

In a communication system, channel encoding is usually used to improve reliability of data transmission and ensure communication quality. A polar code proposed by Arikan, a Turkish professor, is a first code that can be theoretically proved to reach a Shannon capacity and that has low encoding and decoding complexity. The polar code is a linear block code. An encoding matrix of the polar code is $G_N$, and an encoding process is $x_1^N = u_1^N G_N$, where $u_1^N = (u_1, u_2, \ldots, U_N)$, $u_1^N$ is a binary row vector whose length is N (which is a mother code length), $G_N$ is an N×N matrix, and $G_N = F_2^{\otimes \log_2(N)}$. $F_2^{\otimes \log_2(N)}$ is defined as a Kronecker product of $\log_2(N)$ matrices $F_2$. The matrix $F_2$ satisfies $$F_2 = \begin{bmatrix} 1 & 0 \\ 1 & 1 \end{bmatrix}.$$

In a polar-code-based encoding process, some bits in $u_1^N$ are used to carry information and are referred to as information bits, and an index set of these bits is denoted as A; other bits are set to a fixed value agreed on by a transmit end and a receive end in advance and are referred to as fixed bits or frozen bits, and an index set of these bits is represented by $A^C$ that is a complementary set of A. The polar-code-based encoding process is equivalent to: $x_1^N = u_A G_N(A) \oplus u_{A_c} G_N(A^C)$. $G_N(A)$ is a submatrix in $G_N$ obtained from rows corresponding to indexes in the set A, $G_N(A^C)$ is a submatrix in $G_N$ obtained from rows corresponding to indexes in the set $A^C$, $u_A$ is an information bit set in $u_1^N$, a quantity of information bits is K, $u_{A_c}$ is a fixed bit set in $u_1^N$, a quantity of fixed bits is (N–K), and the fixed bits are known bits. These fixed bits are usually set to 0, but the fixed bits may be set to any value agreed on by the transmit end and the receive end in advance. When the fixed bits are set to 0, output of polar-code-based encoding may be simplified as $x_1^N = u_A G_N(A)$, $G_N(A)$ being a K×N matrix.

In actual application, the transmit end may transmit the polar code through parallel sub-channels. Reliability of these sub-channels is different. Generally, a sub-channel with higher reliability is allocated to the information bits for transmitting information, and a known value is allocated to a sub-channel with lower reliability as a fixed bit or a frozen bit. In a polar-code-based decoding process, a value of the sub-channel allocated to the fixed bit is known, and decoding does not need to be performed. However, a value of the sub-channel allocated to the information bits is unknown, and decoding needs to be performed.

A construction process of the polar code is a selection process of the set A. This determines performance of the polar code. The construction process of the polar code usually includes: determining, based on the mother code length N, that there are N polarized channels in total respectively corresponding to N rows of the encoding matrix; calculating reliability of the polarized channels; using indexes of first K polarized channels with higher reliability as elements of the set A; and using indexes corresponding to remaining (N–K) polarized channels as elements of the fixed bit index set A c. The set A determines positions of the information bits, and the set A c determines positions of the fixed bits. It can be learned, from the encoding matrix that, a polar code of any code length needs to be implemented in actual application through rate matching because a code length of an original polar code (mother code) is an integer power of 2.

Polar-code-based decoding, that is, polar decoding, may be used in both channel communication and source compression. Currently, a mainstream polar decoding method may be classified into polar-code-based sequential decoding and polar-code-based non-sequential decoding according to a decoding time sequence of the polar code. Polar-code-based sequential decoding means that a decoder performs bit-by-bit decoding based on a natural time sequence designed for the polar code. Polar-code-based non-sequential decoding means that the decoder concurrently outputs decoding results based on another structure (for example, a Tanner graph or a trellis graph) of the polar code. Currently, polar-code-based sequential decoding algorithms include successive cancellation (SC) decoding, successive cancellation list (SCL) decoding, and successive cancellation stack (SCS) decoding, cyclic redundancy check aided successive cancellation list (CA-SCL) decoding, and the like. Polar non-sequential decoding algorithms include belief propagation (BP) decoding, and the like. Currently, SCL decoding and CA-SCL decoding are mainly used in actual systems.

To better understand the communication method and apparatus according to the embodiments of the present disclosure, the following first describes an application scenario used in the embodiments of the present disclosure. A typical broadcast channel model is shown in FIG. 1. The network device may send information to a terminal device 1 through a channel 1, and may send information to a terminal device 2 through a channel 2. In actual wireless communication, there is usually a specific difference between communication quality of the terminal device 1 and communication quality of the terminal device 2 due to impact of various factors. In channel modeling, there is a difference between a condition of the channel 1 and a condition of the channel 2. It is assumed that the condition of the channel 2 is poorer than the condition of the channel 1, that is, the terminal device 1 has a better channel environment and a faster potential communication rate than the terminal device 2.

Currently, an instant communication solution for the foregoing broadcast channel is commonly known as a "Cannikin Law" method, that is, a transmit end designs an encoding solution only based on a receive end whose channel condition is poorer. To be specific, it is assumed that a channel capacity of the terminal device 1 is $c_1$, a channel capacity of the terminal device 2 is $c_2$, and $c_1 > c_2$. The transmit end designs a polar coding scheme only based on $c_2$ to implement simultaneous communication with the two terminal devices. In this case, the terminal device 1 can also independently complete decoding because the channel of the terminal device 1 is better than that of the terminal device 2. Both terminal devices can properly restore data. However, the polar coding scheme designed based on the "Cannikin Law" method wastes a part of the channel capacity of the terminal device 1, resulting in a waste of resources.

Figure 2:
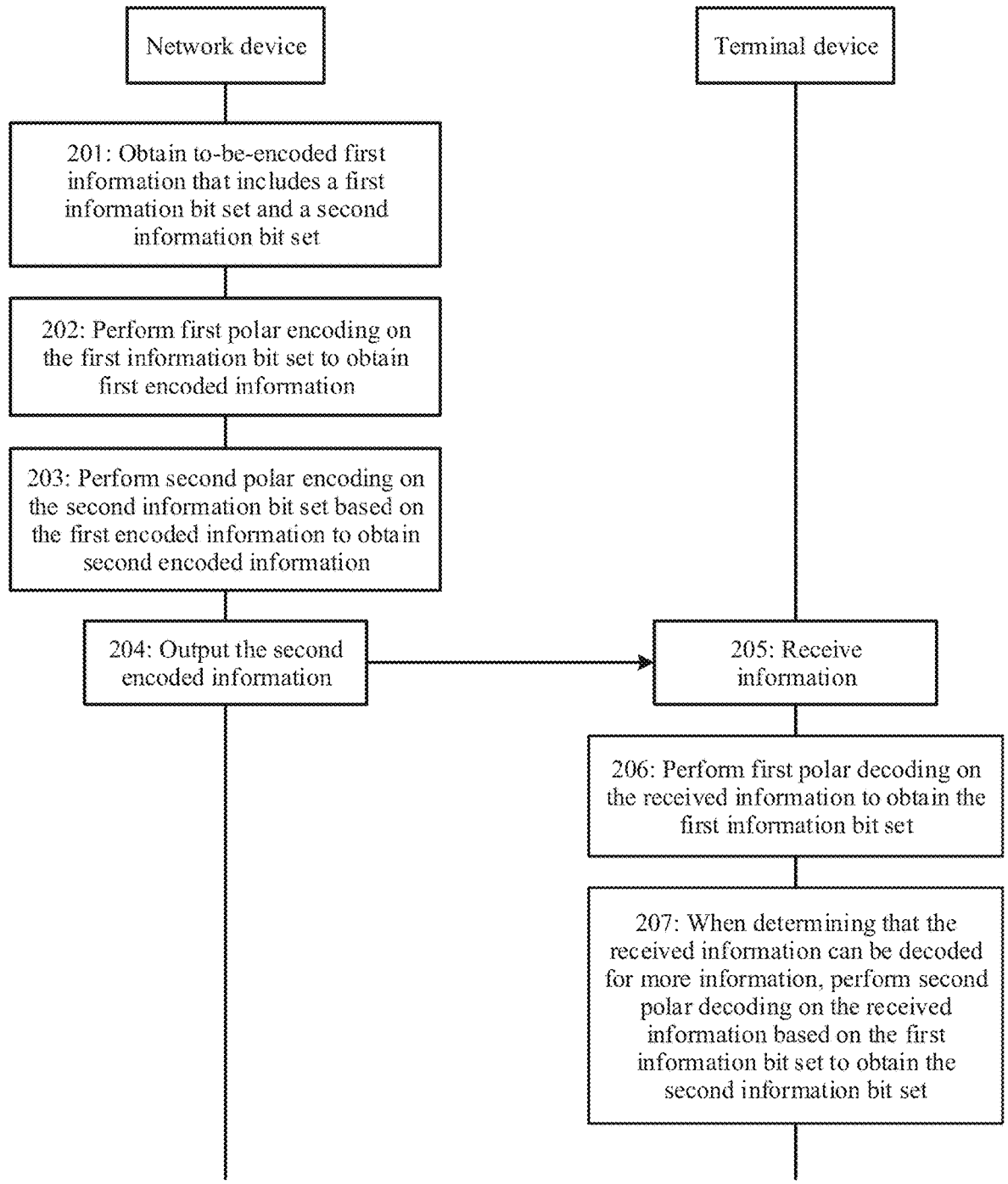
FIG. 2 is a schematic flowchart of a communication method according to an embodiment of the present disclosure.

Based on the network architecture shown in FIG. 1, FIG. 2 is a schematic flowchart of a communication method according to an embodiment of the present disclosure. The following describes in detail steps of the communication method. It may be understood that, in this application, a function performed by a network device may alternatively be performed by a chip in the network device, and a function performed by a terminal device may alternatively be performed by a chip in the terminal device.

201: The network device obtains to-be-encoded first information that includes a first information bit set and a second information bit set.

In a broadcast system, when requiring the first information, the terminal device may send, to the network device, an information obtaining request used to obtain the first information. The network device obtains the first information after simultaneously receiving, from a plurality of terminal devices, information obtaining requests used to obtain the first information. When channel capacities of the plurality of terminal devices are the same, the network device may select some or all of the first information to perform polar encoding, and broadcast encoded information to the plurality of terminal devices. Whether to select some or all of the information is determined based on the channel capacities of the terminal devices.

When the channel capacities of the plurality of terminal devices include two or more different channel capacities, the network device may select the first information bit set from the first information. Bits included in the first information bit set can be obtained through correct decoding by the plurality of terminal devices. Alternatively, the network device may select the second information bit set from the first information. Bits included in the second information bit set can be obtained through correct decoding by some of the plurality of terminal devices. The first information bit set may include necessary information in the first information. In addition, the first information bit set may further include unnecessary information in the first information. The second information bit set may include the unnecessary information in the first information. The necessary information in the first information is information necessary for correct use of the first information. The unnecessary information in the first information is information that may or may not exist in the first information. To be specific, the first information can still be correctly used if the information is not included, but the first information can be better used if the information is included. For example, when the first information is video information, the first information bit set may be a set of F frames in the first information, and the second information bit set may be a set of T frames in the first information.

202: The network device performs first polar encoding on the first information bit set to obtain first encoded information.

After obtaining the to-be-encoded first information that includes the first information bit set and the second information bit set, the network device may perform first polar encoding on the first information bit set to obtain the first encoded information. The network device may perform first polar encoding on the first information bit set and a first fixed bit set to obtain the first encoded information. The first fixed bit set may be a set of fixed bits of a terminal device having a smallest channel capacity in the plurality of terminal devices.

203: The network device performs second polar encoding on the second information bit set based on the first encoded information to obtain second encoded information.

After performing first polar encoding on the first information bit set to obtain the first encoded information, the network device may perform second polar encoding on the second information bit set based on the first encoded information to obtain the second encoded information. In this way, the network device may implement superposition encoding on the first information bit set and the second information bit set. In other words, the second encoded information includes not only the first information bit set, but also the second information bit set. The network device may compress the first encoded information to obtain compressed information, that is, perform source compression on the first encoded information to obtain the compressed information. Then, the network device performs second polar encoding on the second information bit set and the compressed information to obtain the second encoded information. The network device may compress the first encoded information based on a second fixed bit set and the second information bit set to obtain the compressed information. The second fixed bit set is a set of fixed bits of a terminal device having a largest channel capacity in the plurality of terminal devices. The network device may perform second polar encoding on the second fixed bit set, the second information bit set, and the compressed information to obtain the second encoded information.

204: The network device outputs the second encoded information.

After performing second polar encoding on the second information bit set based on the first encoded information to obtain the second encoded information, the network device broadcasts the second encoded information to the terminal devices.

205: The terminal device receives information from the network device.

After the network device sends the second encoded information to the terminal device, the terminal device receives the information broadcast by the network device. The received information is received information corresponding to the second encoded information. Because the second encoded information is affected by noise and the like in a transmission process, the received information may be different from the second encoded information.

206: The terminal device performs first polar decoding on the received information to obtain the first information bit set.

After the terminal device receives the information from the network device, when the terminal device is a terminal device that requests the received information from the network device, the terminal device can obtain the first information bit set by performing first polar decoding on the received information. When the terminal device is not a terminal device that requests the received information from the network device, the terminal device cannot obtain the first information bit set by performing decoding on the received information. In other words, only a terminal device that requests information from the network device can correctly decode information.

207: When determining that the received information can be decoded for more information, the terminal device performs second polar decoding on the received information based on the first information bit set to obtain the second information bit set.

After performing first polar decoding on the received information to obtain the first information bit set, the terminal device may determine whether the received information can be decoded for more information. When determining that the received information cannot be decoded for more information, the terminal device may stop performing decoding and use the first information bit set. When determining that the received information can be decoded for more information, the terminal device may perform second polar decoding on the received information based on the first information bit set to obtain the second information bit set. The terminal device may perform polar encoding on the first information bit set to obtain the first encoded information, and then perform second polar decoding on the first encoded information and the received information to obtain the second information bit set.

The terminal device may perform polar encoding on the first information bit set and the first fixed bit set to obtain the first encoded information. The first fixed bit set is a set of fixed bits of the terminal device having the smallest channel capacity in the plurality of terminal devices. The plurality of terminal devices are terminal devices that can correctly perform decoding to obtain the first information bit set.

When the network device needs to simultaneously send the first information to the plurality of terminal devices, and the channel capacities of plurality of terminal devices include two different channel capacities, three channels may be manually constructed to fully use the channel capacities of the terminal devices: a first constructed channel, a second constructed channel, and a third constructed channel. The first constructed channel is a channel between the first encoded information and the terminal device having the smallest channel capacity in the plurality of terminal devices, and is used to transmit the first information bit set. The second constructed channel is a channel among the first encoded information, the second encoded information, and the terminal device having the largest channel capacity in the plurality of terminal devices. The third constructed channel is a channel between the first encoded information and the second encoded information. The second constructed channel and third constructed channel are used to process the second information bit set. That bits included in the first information bit set can be obtained through correct decoding by the plurality of terminal devices includes: $K_1/N$ is less than $C_1$ or $K_1/N$ is equal to $C_1$, $K_1$ is a quantity of the bits included in the first information bit set, N is a mother code length, and $C_1$ is a capacity of the first constructed channel. That bits included in the second information bit set can be obtained through correct decoding by some of the plurality of terminal devices includes: $K_2/N$ is less than $C_2$ or $K_2/N$ is equal to $C_2$, $K_2$ is a quantity of the bits included in the second information bit set, and $C_2$ is a difference between a capacity of the second constructed channel and a capacity of the third constructed channel. The capacity of the first constructed channel may be $I(V; Y_1)$, V is the first encoded information, $Y_1$ is information that corresponds to the second encoded information and that is correctly received by the terminal device having the smallest channel capacity in the plurality of terminal devices, and $I(V; Y_1)$ is mutual information between V and Yr. The capacity of the second constructed channel may be $I(X; V, Y_2)$, X is the second encoded information, $Y_2$ is information that corresponds to the second encoded information and that is correctly received by the terminal device having the largest channel capacity in the plurality of terminal devices, and $I(X; V, Y_2)$ is mutual information between X, and V and $Y_2$. The capacity of the third constructed channel may be $I(X; V)$, and $I(X; V)$ is mutual information between X and V. A channel capacity of a first terminal device may be $I(X; Y)$, Y is information that corresponds to X and that is correctly received by the first terminal device, and the first terminal device is any one of the plurality of terminal devices. N may be fixed. N may alternatively be variable. When N is variable, N may be determined based on Kr, to ensure that the first information bit set includes all the necessary information in the first information.

Figure 3:
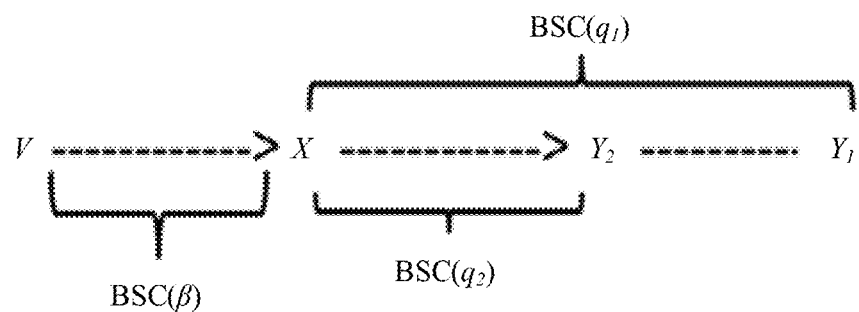
FIG. 3 shows a system model according to an embodiment of the present disclosure.
Figure 4:
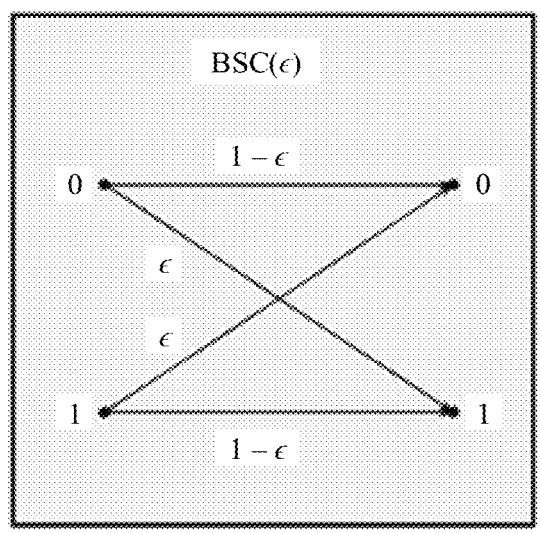
FIG. 4 is a schematic diagram of a crossover probability of a BSC according to an embodiment of the present disclosure.

FIG. 3 shows a system model according to an embodiment of the present disclosure. As shown in FIG. 3, X is a signal sent by a network device to a terminal device. $Y_1$ is a signal received by a terminal device with a poor channel condition. $Y_2$ is a signal received by a terminal device with a good channel condition. V is an auxiliary variable that is set to implement coding of a plurality of terminal devices, and exists only in an encoding process of the network device and a decoding process of the terminal devices. In the present disclosure, a channel other than a constructed channel is a real physical channel. To be specific, a channel from X to $Y_1$ and a channel from X to $Y_2$ may be described by binary symmetric channels (BSCs). The transmit end may send 0 or 1 at a probability of 0.5, and a probability of an error that occurs during transmission through the BSC is ϵ, that is, a probability of a case in which 0 is sent but 1 is received, or 1 is sent but 0 is received. ϵ may be referred to as a crossover probability of the BSC. FIG. 4 is a schematic diagram of a crossover probability of a BSC according to an embodiment of the present disclosure. As shown in FIG. 4, quality of the BSC may be measured based on ϵ. A smaller difference between $\epsilon$ and 0.5 indicates a poorer channel condition, and a smaller difference between $\epsilon$ and 0 indicates a better channel condition. A channel capacity of the BSC may be 1+$\epsilon$ $\log_2\epsilon$+(1−$\epsilon$)$\log_2$ (1−$\epsilon$). It can be seen that the channel capacity decreases with an increase of $\epsilon$. A channel from X to $Y_1$ may be represented by BSC($q_1$), a channel from X to $Y_2$ may be represented by BSC($q_2$), and $q_1$>$q_2$.

According to a conventional encoding scheme, that is, a "Cannikin Law" method, encoding is designed only at X. To ensure that information carried in X can be correctly decoded at $Y_1$ and $Y_2$, encoding is designed based on a poorest channel condition. In other words, a transmission rate R needs to be less than a capacity of the channel X→$Y_1$, that is, 1+$q_1$ $\log_2 q_1$+(1−$q_1$)$\log_2$ (1−$q_1$). However, some resources of the channel X→$Y_2$ are wasted. In this way, it may be considered to match the channels with different transmission rates. This results in different transmission content. All terminal devices can recover some basic information from $Y_1$ or $Y_2$. A terminal device corresponding to $Y_2$ can recover some additional information thanks to a better channel condition. In this case, a variable V may be assumed. A relationship between V and X is represented by BSC($\beta$), $\beta$ is an adjustable variable, and affects proportional allocation of the basic information and the additional information that can be recovered by the terminal devices corresponding to $Y_1$ and $Y_2$. The variable V may be used to carry the basic information. A transmission rate of the terminal device corresponding to $Y_1$ may be I(V; $Y_1$). It can be seen from FIG. 3 that a channel from V to X is BSC($\beta$), and a channel from X to $Y_1$ is BSC($q_1$). Therefore, a channel from V to $Y_1$ is a cascade of the two BSCs, and has a crossover probability of $\beta$*$q_1$=$\beta$ (1−$q_1$)+(1−$\beta$)·$q_1$. An upper limit of a transmission rate of the basic information is a capacity of the channel V→$Y_1$, that is 1+($\beta$*$q_1$)$\log_2$ ($\beta$*$q_1$)+(1−$\beta$*$q_1$)$\log_2$ (1−$\beta$*$q_1$). This is an origin of the first constructed channel. The basic information herein is the foregoing necessary information, and the additional information herein may be the foregoing unnecessary information.

An upper limit of a transmission rate of the additional information is I(X; $Y_2$ |V), that is, mutual information that $Y_2$ can extract from X with a given V. V is given because ✓ includes the basic information. The terminal device corresponding to $Y_2$ needs to recover ✓ first, and then obtains the additional information based on V. However, I(X; $Y_2$|V)=I(X; $Y_2$, V)−I(X; V). In this case, design of the additional information can be divided into design of I(X; $Y_2$, V) and design of I(X; V). I(X; $Y_2$, V) is a capacity of a second constructed channel, and I(X; V) is a capacity of a third constructed channel. The upper limit of the transmission rate of the additional information is a difference between the capacities of the two channels. According to a Shannon capacity formula, it can be concluded that:

$$I(X;Y_2|V)=q_2 \log_2(q_2)+(1-q_2)\log_2(1-q_2)-(\beta*q_2)\log_2(\beta*q_2)-(1-\beta*q_2)\log_2(1-\beta*q_2)$$

Figure 5:
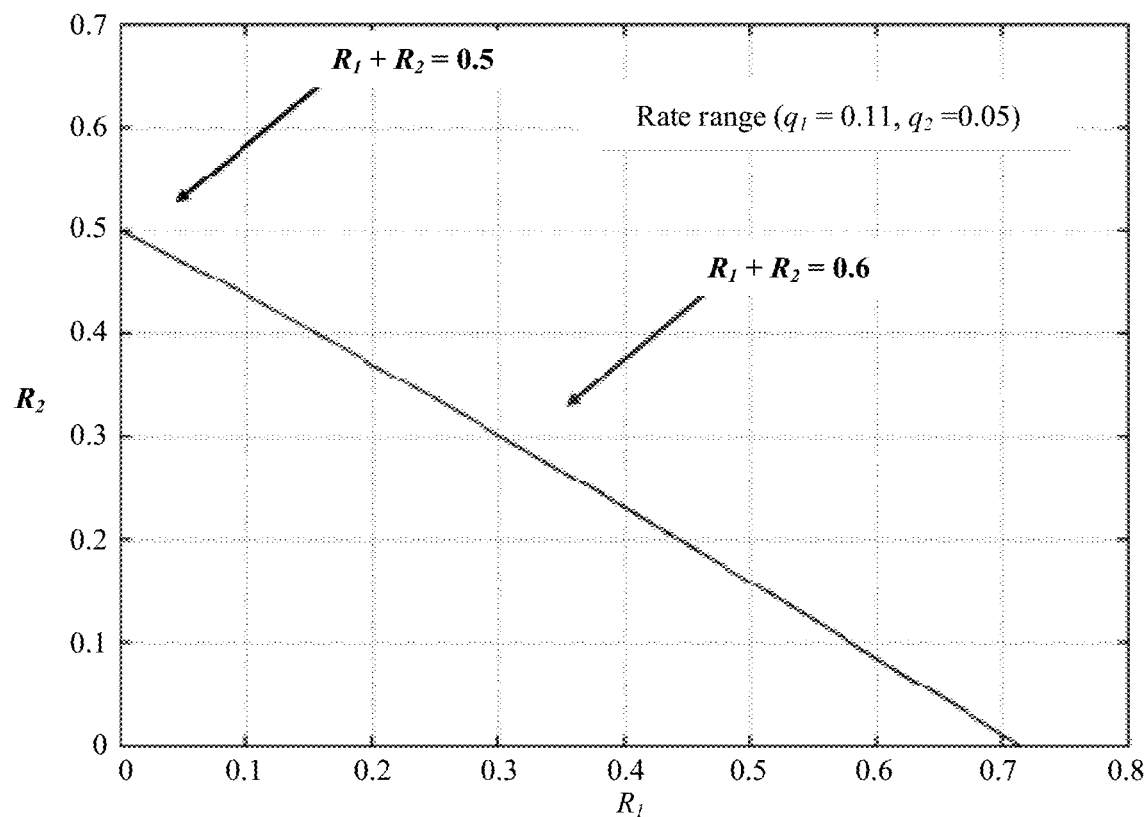
FIG. 5 is a diagram of comparison in a rate range according to an embodiment of the present disclosure.

FIG. 5 is a diagram of comparison in a rate range according to an embodiment of the present disclosure. Points on a straight line in FIG. 5 are obtained by adjusting a value of $\beta$ when $q_1$=0.11 and $q_2$=0.05. Two endpoints of the straight line correspond to two extreme cases. When $\beta$=0, X is V. Therefore, I(V; $Y_2$)=I(X; $Y_2$), and I(X; $Y_2$|V)=0. In other words, all resources are used to transmit the basic information, and there is no additional information. This corresponds to a point in an upper left corner of the straight line. When $\beta$=1, X and V are irrelevant. Therefore, I(V; $Y_2$)=0, and I(X; $Y_2$|V)=I(X; $Y_2$). In other words, all resources are used to transmit the additional information, and there is no basic information. This corresponds to a point in a lower right corner of the straight line. The value of $\beta$ may be adjusted based on specific requirements to adjust proportions of the basic information and the additional information. For example, when $\beta$=0.1, both $R_1$ and $R_2$ are about 0.3, and distribution of the two parts is similar. The BSCs may be replaced by binary input additive white Gaussian noise (BIAWGN) channels. A concept of the BIAWGN channel is the same as that described above. A relationship between V and X may be represented by BIAWGN($\beta$). A channel from X to $Y_1$ may be represented by BIAWGN($\sigma_1$), a channel from X to $Y_2$ may be represented by BIAWGN($\sigma_2$), and $\sigma_2$<$\sigma_1$. BIAWGN($\sigma_1$) indicates that white Gaussian noise carried by the BIAWGN channel is $\sigma$2/1, and BIAWGN($\sigma_2$) indicates that white Gaussian noise carried by the BIAWGN channel is $\sigma$2/2.

Figure 6:
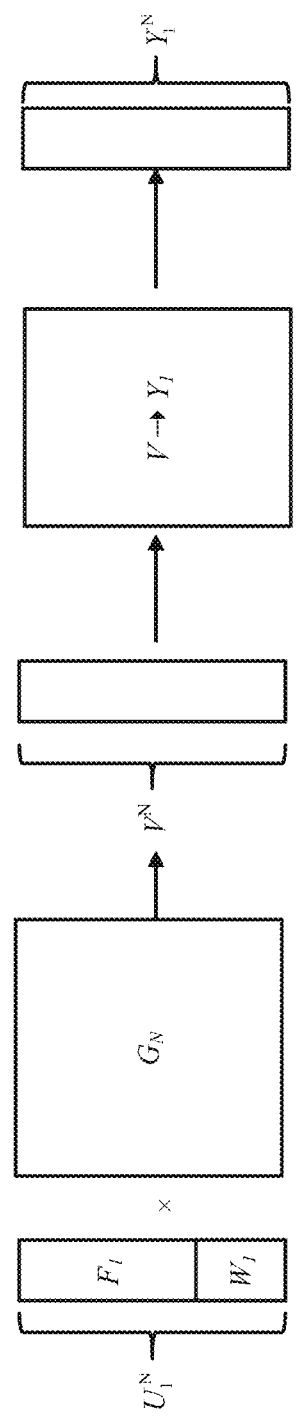
FIG. 6 is a schematic diagram of polar-code-based encoding and transmission according to an embodiment of the present disclosure.

FIG. 6 is a schematic diagram of polar-code-based encoding and transmission according to an embodiment of the present disclosure. As shown in FIG. 6, when a plurality of terminal devices include two different channel capacities, a 1×N matrix $U_1^N$ formed by $F_1$ and $W_1$ may be multiplied by an encoding matrix $G_N$ to obtain $V^N$, that is, polar encoding is performed on $F_1$ and $W_1$ to obtain V. $F_1$ is a first fixed bit set. $W_1$ is a first information bit set. According to a channel polarization technology, N independent first constructed channels (V→$Y_1$) may be combined to participate in channel polarization, where N=$2^m$. Then, $V^N$ is input to the N channels to obtain $Y_1^N$. $V^N$ is input to a binary channel for polarization transformation to obtain a vector $U_1^N$, that is, $U_1^N$=$V^N G_N$. According to a polar code principle, N polarized channels may be obtained at an end $U_1^N$, and an $i^{th}$ polarized channel uses $U_1^i$ as an input, and uses ($U_1^{1:i-1}$, $Y_1^N$) as an output. When N is large enough, a channel capacity of any polarized channel tends to 0 or 1 at a probability of 1, that is, the polarized channel becomes a useless channel or a perfect channel. According to a principle of conservation of a total channel capacity in polar coding, a proportion of the perfect channel is an original channel capacity I(V; $Y_1$). In other words, for any 0<$\delta$<1, the following relationship is satisfied:

$$\lim_{N\to\infty} \frac{|i \in [N] : I(U_1^i; U_1^{1:i-1}, Y_1^N) > 1 - \delta|}{N} = I(V; Y_1)$$

A set {i∈[N]:I($U_1^i$; $U_1^{1:i-1}$, $Y_1^N$)≥1−$\delta$} is denoted as $F_1$.

Figure 7:
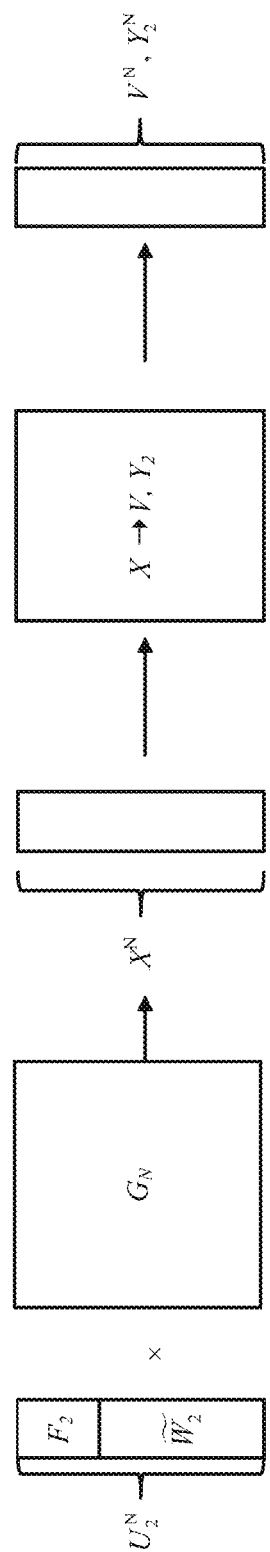
FIG. 7 is another schematic diagram of polar-code-based encoding and transmission according to an embodiment of the present disclosure.

FIG. 7 is another schematic diagram of polar-code-based encoding and transmission according to an embodiment of the present disclosure. As shown in FIG. 7, a 1×N matrix $U_2^N$ formed by $F_2$ and $\hat{W}_2$ may be multiplied by an encoding matrix $G_N$ to obtain $X^N$, that is, polar encoding is performed on $F_2$ and $W_2$ to obtain X. $F_2$ is a second fixed bit set. $W_2$ is an information bit set that corresponds to a second constructed channel and that is of a terminal device corresponding to a larger channel capacity in the two different channel capacities. The N second constructed channels (X→V, $Y_2$) may be combined to participate in channel polarization, and then $X^N$ is input to the N channels to obtain ($V^N$, $Y_2^N$). $X^N$ is input for polarization transformation to obtain $U_2^N$=$X^N G_N$. Similarly, according to a polar code theory, a set {i∈[N]:I($U_2^i$; $U_2^{1:i-1}$, $Y_2^N$, $V^N$)>1−$\delta$} is denoted as $\hat{W}_2$ and {i∈[N]:I($U_2^i$; $U_2^{1:i-1}$, $Y_2^N$, $V^N$)≤1−$\delta$} is denoted as $F_2$. A value of $\hat{W}_2$ satisfies the following relationship:

$$\lim_{N\to\infty} \frac{|i \in [N] : I(U_2^i; U_2^{1:i-1}, Y_2^N, V^N) > 1 - \delta|}{N} = I(X; V, Y_2)$$

However, in an actual encoding process, V''' is an encoded signal of $W_1$, and is generated before encoding $W_2$. $W_2$ is a second information bit set. This means that V''' can be observed in an encoding process of $W_2$. Therefore, a first constructed channel ($V \rightarrow Y_1$) needs to be checked.

Figure 8:
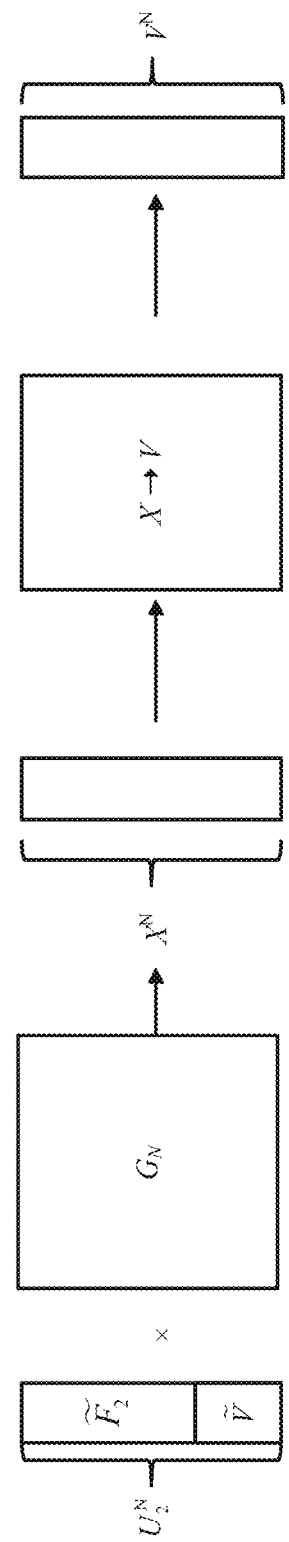
FIG. 8 is still another schematic diagram of polar-code-based encoding and transmission according to an embodiment of the present disclosure.

FIG. 8 is still another schematic diagram of polar-code-based encoding and transmission according to an embodiment of the present disclosure. As shown in FIG. 8, after a second constructed channel is polarized, it can be found that some bits in $U_2^N$ are all determined by $V^N$. This is determined by the second constructed channel, that is, a relationship between X and V. A 1×N matrix $U_2^N$ formed by $\tilde{F}_2$ and $\tilde{V}$ may be multiplied by an encoding matrix $G_N$ to obtain $X^N$, that is, polar encoding is performed on $\tilde{F}_2$ and $\tilde{V}$ to obtain X. $\tilde{F}_2$ may be considered as a fixed bit set that corresponds to the second constructed channel and that is of a terminal device corresponding to a smaller channel capacity in the two different channel capacities. $\tilde{V}$ may be considered as an information bit set that corresponds to the second constructed channel and that is of the terminal device corresponding to a smaller channel capacity in the two different channel capacities. Similarly, according to a polar code principle, a set $\{i \in [N]:(U_2^i; U_2^{1:i-1}, Y_2^N, V^N) > \delta\}$ is denoted as $\tilde{V}$. $\{i \in [N]:I(U_2^i, U_2^{1:i-1}, V^N) \leq \delta\}$ is denoted as $\tilde{F}_2$. A value of 17 satisfies the following relationship:

$$\lim_{N \to \infty} \frac{|i \in [N] : I(U_2^i; U_2^{1:i-1}, V^N) > \delta|}{N} = I(X; V)$$

The foregoing is actually a process of performing lossy compression on V''' to obtain $\tilde{V}$. According to a source polarization principle, a Shannon limit needs to be approximated from another end of mutual information. Therefore, a threshold here is $\delta$ not 1−$\delta$, but a limit value of a proportion remains unchanged. It can be seen that, when $V^N$ is observed, $\tilde{V}$ may be almost completely solved by $V^N$. Therefore, these bits are actually fixed and cannot be used to transmit information. Therefore, V is eliminated from a set $\tilde{W}_1$ to obtain $W_2$, that is, $\{i \in [N]:I(U_2^i, U_2^{1:i-1}, Y_2^N, V^N) > 1-\delta$ and $I(U_2^i, U_2^{1:i-1}, V^N) \leq \delta\}$. A value of $W_2$ satisfies:

$$\lim_{N \to \infty} \frac{|i \in [N] : I(U_2^i; U_2^{1:i-1}, Y_2^N, V^N) > 1-\delta \text{ and } I(U_2^i; U_2^{1:i-1}, V^N) \leq \delta|}{N} = I(X; V, Y_2) - I(X; V)$$

Figure 9:
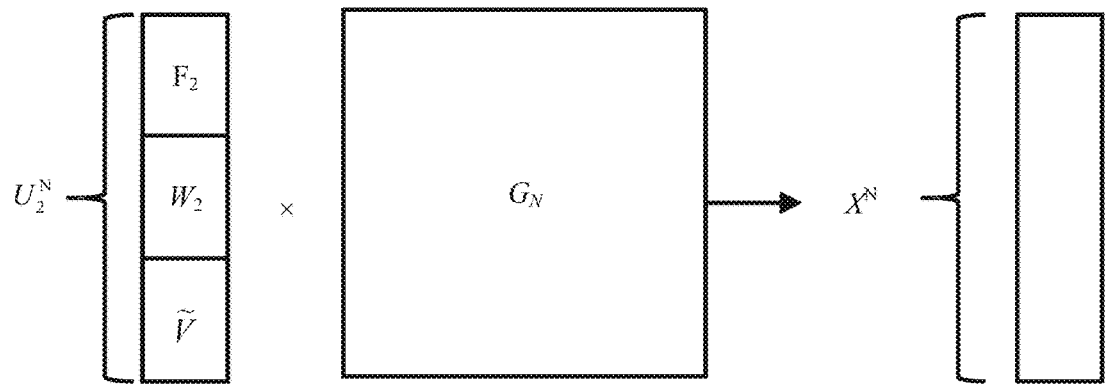
FIG. 9 is a schematic diagram of polar encoding according to an embodiment of the present disclosure.

FIG. 9 is a schematic diagram of polar encoding according to an embodiment of the present disclosure. As shown in FIG. 9, a 1×N matrix $U_2^N$ formed by $F_2$, $W_2$, and $\tilde{V}$ may be multiplied by an encoding matrix $G_N$ to obtain $X^N$, that is, polar encoding is performed on $F_2$, $W_2$, and $\tilde{V}$ to obtain X. $W_2$ is a second information bit set. $\tilde{V}$ is obtained through decoding based on $V^N$ and a transition probability of a second constructed channel. $X^N$ is a superposition-encoded signal of an entire system.

It can be learned from the foregoing analysis that an entire superposition encoding process is: performing first polar encoding on $W_1$ to obtain V, then compressing V to obtain $\tilde{V}$, and finally performing second polar encoding on $W_2$ and $\tilde{V}$ to obtain X.

Figure 10:
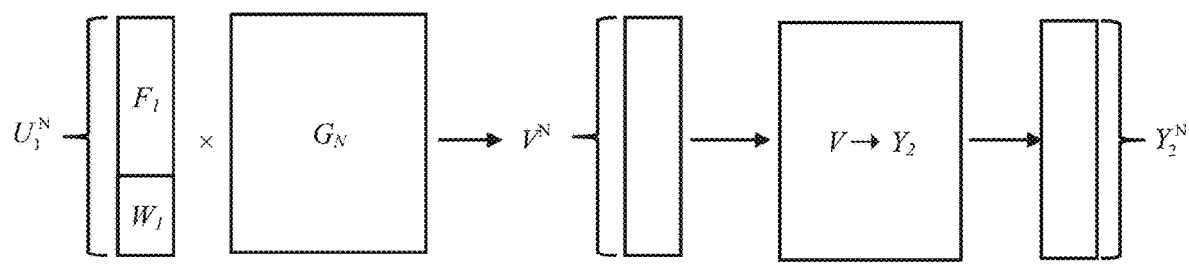
FIG. 10 is a schematic diagram of polar decoding according to an embodiment of the present disclosure.

FIG. 10 is a schematic diagram of polar decoding according to an embodiment of the present disclosure. As shown in FIG. 10, the decoding is decoding of a terminal device corresponding to a larger channel capacity in two different channel capacities. The decoding process is opposite to an encoding process. A signal $Y_2^N$ is received and decoded to obtain $W_1$, that is, $Y_2^N$ is input into a decoder to obtain $U_1^N$. Then, $F_1$ is eliminated from $U_1^N$ to obtain $W_1$. This process is similar to a decoding process of a terminal device corresponding to a smaller channel capacity in the two different channel capacities. Then, polar encoding is performed on $F_1$ and $W_1$ to obtain $V^N$. Then, according to FIG. 5, $W_2$ may be obtained by performing decoding based on $V^N$ and $Y_2^N$. A decoding algorithm may be SC, SCL, CA-SCL, BP, or the like. The block $V \rightarrow Y_2$ in FIG. 10 is similar to the block $V \rightarrow Y_1$ in FIG. 6.

After $W_1$ is obtained through decoding, a capacity of a constructed channel between first encoded information and received information may be calculated, that is, $I(V; Y_3)$ is calculated. $Y_3$ is the received information received by the terminal device. $Y_3$ may be $Y_1$ or $Y_2$. Then, $I(V; Y_3)$ is compared with $I(V; Y_1)$. When $I(V; Y_3)$ is greater than $I(V; Y_1)$, it is determined that the received information can be decoded for more information.

Figure 11:
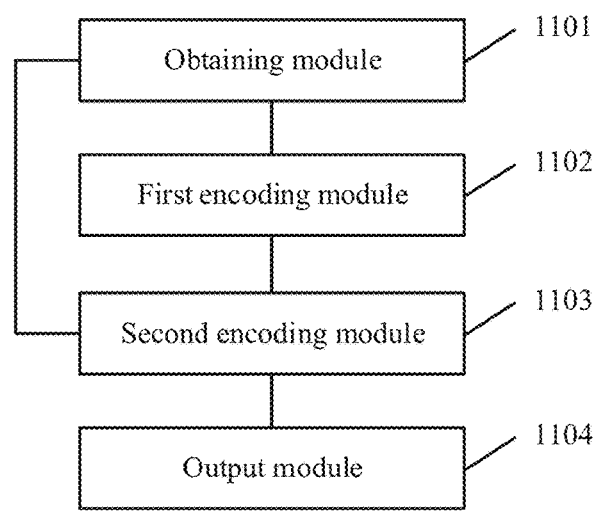
FIG. 11 is a schematic diagram of a structure of a communication apparatus according to an embodiment of the present disclosure.

Based on the network architecture shown in FIG. 1 and a same concept as the communication methods in the foregoing embodiments, FIG. 11 is a schematic diagram of a structure of a communication apparatus according to an embodiment of the present disclosure. The communication apparatus may be a network device or a chip in the network device. As shown in FIG. 11, the communication apparatus may include:

an obtaining module 1101, configured to obtain to-be-encoded first information, where the first information includes a first information bit set and a second information bit set, bits included in the first information bit set can be obtained through correct decoding by a plurality of terminal devices, and bits included in the second information bit set can be obtained through correct decoding by some of the plurality of terminal devices;

a first encoding module 1102, configured to perform first polar encoding on the first information bit set to obtain first encoded information;

a second encoding module 1103, configured to perform second polar encoding on the second information bit set based on the first encoded information to obtain second encoded information; and an output module 1104, configured to output the second encoded information.

In an embodiment, that bits included in the first information bit set can be obtained through correct decoding by a plurality of terminal devices includes: $K_1/N$ is less than $C_1$ or $K_1/N$ is equal to $C_1$, $K_1$ is a quantity of the bits included in the first information bit set, N is a mother code length, $C_1$ is a capacity of a first constructed channel, and the first constructed channel is a channel between the first encoded information and a terminal device having a smallest channel capacity in the plurality of terminal devices.

That bits included in the second information bit set can be obtained through correct decoding by some of the plurality of terminal devices includes: $K_2/N$ is less than $C_2$ or $K_2/N$ is equal to $C_2$, $K_2$ is a quantity of the bits included in the second information bit set, $C_2$ is a difference between a capacity of a second constructed channel and a capacity of a third constructed channel, the second constructed channel is a channel among the first encoded information, the second encoded information, and a terminal device having a largest channel capacity in the plurality of terminal devices, and the third constructed channel is a channel between the first encoded information and the second encoded information.

In an embodiment, the first information bit set includes necessary information in the first information, and the second information bit set includes unnecessary information in the first information.

In an embodiment, the first encoding module 1102 is configured to perform first polar encoding on the first information bit set and a first fixed bit set to obtain the first encoded information. The first fixed bit set is a set of fixed bits of the terminal device having the smallest channel capacity in the plurality of terminal devices.

In an embodiment, the second encoding module 1103 is configured to:
compress the first encoded information to obtain compressed information; and
perform second polar encoding on the second information bit set and the compressed information to obtain the second encoded information.

In an embodiment, the second encoding module 1103 is configured to:
compress the first encoded information based on a second fixed bit set and the second information bit set to obtain the compressed information, where the second fixed bit set is a set of fixed bits of the terminal device having the largest channel capacity in the plurality of terminal devices.

In an embodiment, that the second encoding module 1103 is configured to:
perform second polar encoding on the second fixed bit set, the second information bit set, and the compressed information to obtain the second encoded information.

In an embodiment, channel capacities of the plurality of terminal devices include two or more different channel capacities.

In an embodiment, the capacity of the first constructed channel is $I(V; Y_1)$, V is the first encoded information, $Y_1$ is information that corresponds to the second encoded information and that is correctly received by the terminal device having the smallest channel capacity in the plurality of terminal devices, and $I(V; Y_1)$ is mutual information between V and Yr.

The capacity of the second constructed channel is $I(X; V, Y_2)$, X is the second encoded information, $Y_2$ is information that corresponds to the second encoded information and that is correctly received by the terminal device having the largest channel capacity in the plurality of terminal devices, and $I(X; V, Y_2)$ is mutual information between X, and V and $Y_2$.

The capacity of the third constructed channel is $I(X; V)$, and $I(X; V)$ is mutual information between X and V.

In an embodiment, a channel capacity of a first terminal device is $I(X; Y)$, Y is information that corresponds to the second encoded information and that is correctly received by the first terminal device, and the first terminal device is any one of the plurality of terminal devices.

For more detailed descriptions of the obtaining module 1101, the first encoding module 1102, the second encoding module 1103, and the output module 1104, refer to related descriptions of the network device in the foregoing method embodiment shown in FIG. 2. Details are not described herein.

Figure 12:
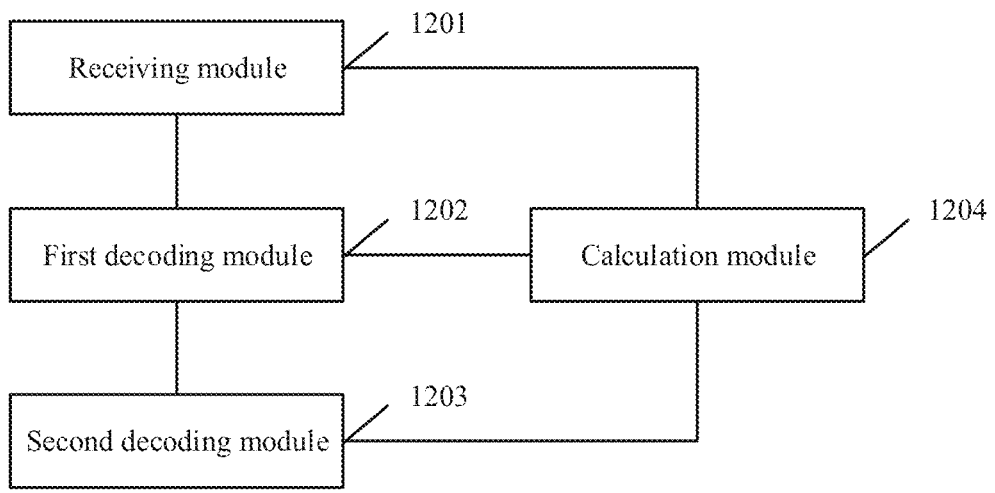
FIG. 12 is a schematic diagram of a structure of another communication apparatus according to an embodiment of the present disclosure.

Based on the network architecture shown in FIG. 1 and a same concept as the communication methods in the foregoing embodiments, FIG. 12 is a schematic diagram of a structure of another communication apparatus according to an embodiment of the present disclosure. The communication apparatus may be a terminal device or a chip in the terminal device. As shown in FIG. 12, the communication apparatus may include:
a receiving module 1201, configured to receive information from a network device;
a first decoding module 1202, configured to perform first polar decoding on the received information to obtain a first information bit set; and
a second decoding module 1203, configured to: when it is determined that the received information can be decoded for more information, perform second polar decoding on the received information based on the first information bit set to obtain a second information bit set, where both the first information bit set and the second information bit set belong to first information.

In an embodiment, the second decoding module 1203 is configured to:
perform polar encoding on the first information bit set to obtain first encoded information; and
perform second polar decoding on the first encoded information and the received information to obtain the second information bit set.

In an embodiment, the second decoding module 1203 is configured to:
perform polar encoding on the first information bit set and a first fixed bit set to obtain the first encoded information, where the first fixed bit set is a set of fixed bits of a terminal device having a smallest channel capacity in a plurality of terminal devices, and the plurality of terminal devices are terminal devices that can correctly perform decoding to obtain the first information bit set.

In an embodiment, the first information bit set is a set of bits of necessary information in the first information, and the second information bit set is a set of bits of unnecessary information in the first information.

In an embodiment, the communication apparatus may further include:
a calculation module 1204, configured to: calculate a capacity of a constructed channel between the first encoded information and the received information; and
when the calculated capacity is greater than a capacity of a first constructed channel, it is determined that the received information can be decoded for more information, where the first constructed channel is a channel between the first encoded information and the terminal device having the smallest channel capacity in the plurality of terminal devices.

In an embodiment, channel capacities of the plurality of terminal devices include two or more different channel capacities.

In an embodiment, the calculation module 1204 is configured to calculate $I(V; Y_1)$, where V is the first encoded information, $Y_1$ is the received information, and $I(V; Y_1)$ is mutual information between V and Yr.

The capacity of the first constructed channel is $I(V; Y_2)$, $Y_2$ is information that is received by the terminal device having the smallest channel capacity in the plurality of terminal devices and that can be correctly decoded to obtain the first information bit set, and $I(V; Y_2)$ is mutual information between V and $Y_2$.

In an embodiment, a channel capacity of a first terminal device is $I(X; Y)$, X is encoded information corresponding to the received information that is sent by the network device, Y is information that is received by the first terminal device and that can be correctly decoded to obtain the first information bit set, I(V; Y) is mutual information between V and Y, and the first terminal device is any one of the plurality of terminal devices.

For more detailed descriptions of the receiving module 1201, the first decoding module 1202, the second decoding module 1203, and the calculation module 1204, refer to related descriptions of the terminal devices in the foregoing method embodiments. Details are not described herein.

Figure 13:
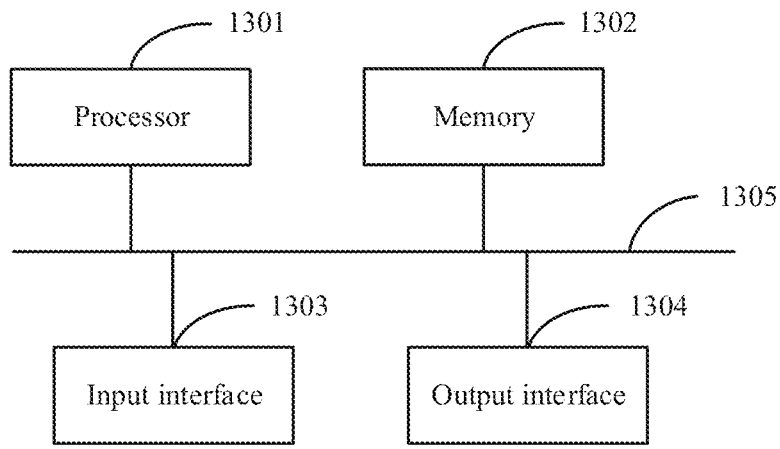
FIG. 13 is a schematic diagram of a structure of still another communication apparatus according to an embodiment of the present disclosure.

Based on the network architecture shown in FIG. 1, FIG. 13 is a schematic diagram of a structure of still another communication apparatus according to an embodiment of the present disclosure. As shown in FIG. 13, the communication apparatus may include a processor 1301, a memory 1302, an input interface 1303, an output interface 1304, and a bus 1305. The memory 1302 may exist independently, and may be connected with the processor 1301 through the bus 1305. Alternatively, the memory 1302 may be integrated with the processor 1301. The bus 1305 is configured to implement connection among these components.

In an embodiment, the communication apparatus may be a network device or a chip in the network device.

The memory 1302 stores a group of computer programs, and the processor 1301 is configured to invoke the computer programs stored in the memory 1302 to perform the following operations:
obtaining to-be-encoded first information, where the first information includes a first information bit set and a second information bit set, bits included in the first information bit set can be obtained through correct decoding by a plurality of terminal devices, and bits included in the second information bit set can be obtained through correct decoding by some of the plurality of terminal devices;
performing first polar encoding on the first information bit set to obtain first encoded information; and
performing second polar encoding on the second information bit set based on the first encoded information to obtain second encoded information.

The output interface 1304 is configured to output the second encoded information.

In an embodiment, that bits included in the first information bit set can be obtained through correct decoding by a plurality of terminal devices includes: Kr/N is less than ci or Kr/N is equal to $C_1$, $K_1$ is a quantity of the bits included in the first information bit set, N is a mother code length, $C_1$ is a capacity of a first constructed channel, and the first constructed channel is a channel between the first encoded information and a terminal device having a smallest channel capacity in the plurality of terminal devices.

That bits included in the second information bit set can be obtained through correct decoding by some of the plurality of terminal devices includes: $K_2$/N is less than $C_2$ or $K_2$/N is equal to $C_2$, $K_2$ is a quantity of the bits included in the second information bit set, $C_2$ is a difference between a capacity of a second constructed channel and a capacity of a third constructed channel, the second constructed channel is a channel among the first encoded information, the second encoded information, and a terminal device having a largest channel capacity in the plurality of terminal devices, and the third constructed channel is a channel between the first encoded information and the second encoded information.

In an embodiment, the first information bit set includes necessary information in the first information, and the second information bit set includes unnecessary information in the first information.

In an embodiment, the processor 1301 is configured to:
perform first polar encoding on the first information bit set and a first fixed bit set to obtain the first encoded information, where the first fixed bit set is a set of fixed bits of the terminal device having the smallest channel capacity in the plurality of terminal devices.

In an embodiment, the processor 1301 is configured to:
compress the first encoded information to obtain compressed information; and
perform second polar encoding on the second information bit set and the compressed information to obtain the second encoded information.

In an embodiment, the processor 1301 is configured to:
compress the first encoded information based on a second fixed bit set and the second information bit set to obtain the compressed information, where the second fixed bit set is a set of fixed bits of the terminal device having the largest channel capacity in the plurality of terminal devices.

In an embodiment, the processor 1301 is configured to:
perform second polar encoding on the second fixed bit set, the second information bit set, and the compressed information to obtain the second encoded information.

In an embodiment, channel capacities of the plurality of terminal devices include two or more different channel capacities.

In an embodiment, the capacity of the first constructed channel is $I(V; Y_1)$, V is the first encoded information, $Y_1$ is information that corresponds to the second encoded information and that is correctly received by the terminal device having the smallest channel capacity in the plurality of terminal devices, and $I(V; Y_1)$ is mutual information between V and Yr.

The capacity of the second constructed channel is $I(X; V, Y_2)$, X is the second encoded information, $Y_2$ is information that corresponds to the second encoded information and that is correctly received by the terminal device having the largest channel capacity in the plurality of terminal devices, and $I(X; V, Y_2)$ is mutual information between X, and V and $Y_2$.

The capacity of the third constructed channel is $I(X; V)$, and $I(X; V)$ is mutual information between X and V.

In an embodiment, a channel capacity of a first terminal device is $I(X; Y)$, Y is information that corresponds to the second encoded information and that is correctly received by the first terminal device, and the first terminal device is any one of the plurality of terminal devices.

In an embodiment, the input interface 1303 is configured to receive information from another communication apparatus.

Step 201 to step 203 may be performed by the processor 1301 and the memory 1302 in the network device. Step 204 may be performed by the output interface 1304 in the network device.

The obtaining module 1101, the first encoding module 1102, and the second encoding module 1103 may be implemented by the processor 1301 and the memory 1302 in the network device, and the output module 1104 may be implemented by the output interface 1304 in the network device.

In another embodiment, the communication apparatus may be a terminal device or a chip in the terminal device.

The input interface 1303 is configured to receive information from the network device.

The memory 1302 stores a group of computer programs, and the processor 1301 is configured to invoke the computer programs stored in the memory 1302 to perform the following operations:

performing first polar decoding on the received information to obtain a first information bit set; and when it is determined that the received information can be decoded for more information, performing second polar decoding on the received information based on the first information bit set to obtain a second information bit set, where both the first information bit set and the second information bit set belong to first information.

In an embodiment, that the processor 1301 performs second polar decoding on the received information based on the first information bit set to obtain a second information bit set includes:

performing polar encoding on the first information bit set to obtain first encoded information; and performing second polar decoding on the first encoded information and the received information to obtain the second information bit set.

In an embodiment, that the processor 1301 performs polar encoding on the first information bit set to obtain first encoded information includes:

performing polar encoding on the first information bit set and a first fixed bit set to obtain the first encoded information, where the first fixed bit set is a set of fixed bits of a terminal device having a smallest channel capacity in a plurality of terminal devices, and the plurality of terminal devices are terminal devices that can correctly perform decoding to obtain the first information bit set.

In an embodiment, the first information bit set is a set of bits of necessary information in the first information, and the second information bit set is a set of bits of unnecessary information in the first information.

In an embodiment, the processor 1301 is further configured to invoke the computer programs stored in the memory 1302 to perform the following operations:

calculating a capacity of a constructed channel between the first encoded information and the received information.

When the calculated capacity is greater than a capacity of a first constructed channel, it is determined that the received information can be decoded for more information, where the first constructed channel is a channel between the first encoded information and the terminal device having the smallest channel capacity in the plurality of terminal devices.

In an embodiment, channel capacities of the plurality of terminal devices include two or more different channel capacities.

In an embodiment, the processor 1301 is configured to:

calculate $I(V; Y_1)$, where V is the first encoded information, $Y_1$ is the received information, and $I(V; Y_1)$ is mutual information between V and Yr.

The capacity of the first constructed channel is $I(V; Y_2)$, $Y_2$ is information that is received by the terminal device having the smallest channel capacity in the plurality of terminal devices and that can be correctly decoded to obtain the first information bit set, and $I(V; Y_2)$ is mutual information between V and $Y_2$.

In an embodiment, a channel capacity of a first terminal device is $I(X; Y)$, X is encoded information corresponding to the received information that is sent by the network device, Y is information that is received by the first terminal device and that can be correctly decoded to obtain the first information bit set, $I(V; Y)$ is mutual information between V and Y, and the first terminal device is any one of the plurality of terminal devices.

In an embodiment, the output interface 1304 is configured to output or send information to another communication apparatus.

Step 206 and step 207 may be performed by the processor 1301 and the memory 1302 in the terminal device. Step 205 may be performed by the input interface 1303 in the terminal device.

The first decoding module 1202, the second decoding module 1203, and the calculation module 1204 may be implemented by the processor 1301 and the memory 1302 in the terminal device, and the receiving module 1201 may be implemented by the input interface 1303 in the terminal device.

Figure 14:
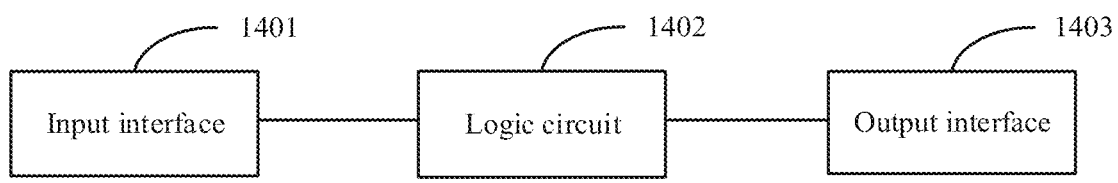
FIG. 14 is a schematic diagram of a structure of yet another communication apparatus according to an embodiment of the present disclosure.

Based on the network architecture shown in FIG. 1, FIG. 14 is a schematic diagram of a structure of yet another communication apparatus according to an embodiment of the present disclosure. As shown in FIG. 14, the communication apparatus may include an input interface 1401, a logic circuit 1402, and an output interface 1403. The input interface 1401 is connected to the output interface 1403 through the logic circuit 1402. The input interface 1401 is configured to receive information from another communication apparatus, and the output interface 1403 is configured to output or send information to the another communication apparatus. The logic circuit 1402 is configured to perform operations other than operations of the input interface 1401 and the output interface 1403, for example, implement functions implemented by the processor 1301 in the foregoing embodiment. The communication apparatus may be a network device or a chip in the network device, or may be a terminal device or a chip in the terminal device. For more detailed descriptions of the input interface 1401, the logic circuit 1402, and the output interface 1403, refer to related descriptions of the network device or the terminal device in the method embodiment shown in FIG. 2. Details are not described herein.

An embodiment of the present disclosure discloses a computer-readable storage medium. The computer-readable storage medium stores a computer program. When the computer program runs, the communication method shown in FIG. 2 is implemented.

The objectives, technical solutions, and benefits of this application are further described in detail in the foregoing specific embodiments. It should be understood that the foregoing descriptions are merely specific embodiments of this application, but are not intended to limit the protection scope of this application. Any modification, equivalent replacement or improvement made based on technical solutions of this application shall fall within the protection scope of this application.

What is claimed is:

1. A communication method applied to a processor of a communication apparatus, the method comprising:
   receiving information from a network device, wherein the information includes first and second information bit sets;
   performing first polar decoding on the received information to obtain the first information bit set;
   determining from the first polar decoding of the received information whether the received information includes further information for decoding; and
   based on determining the received information includes more information for decoding, performing second polar decoding on the received information to obtain the second information bit set.

2. The method according to claim 1, wherein performing the second polar decoding on the received information to obtain the second information bit set comprises:
performing polar encoding on the first information bit set to obtain first encoded information; and
performing second polar decoding on the first encoded information and the received information to obtain the second information bit set.

3. The method according to claim 2, wherein performing the polar encoding on the first information bit set to obtain the first encoded information comprises:
performing polar encoding on the first information bit set and a first fixed value bit set to obtain the first encoded information,
wherein the first fixed value bit set is a set of bits of a terminal device having a smallest channel capacity in a plurality of terminal devices, and
wherein the plurality of terminal devices are terminal devices that are able to correctly perform decoding to obtain the first information bit set.

4. The method according to claim 3, further comprising:
determining a capacity of a constructed channel between a network device that broadcasts the first encoded information and the communication apparatus for receiving the information; and
based on determining the capacity being greater than a capacity of a first constructed channel, the received information is determined to be able to be decoded for more information,
wherein the first constructed channel is a channel between the network device and the terminal device having the smallest channel capacity among channel capacities of the plurality of terminal devices.

5. The method according to claim 4, wherein determining the capacity of the constructed channel between the network device that broadcasts the first encoded information and the communication apparatus for receiving the information comprises:
determining $I(V; Y_1)$, wherein V is the first encoded information, wherein $Y_1$ is the received information, and $I(V; Y_1)$ is mutual information between V and $Y_1$; and
wherein the capacity of the first constructed channel is $I(V; Y_2)$, wherein $Y_2$ is information that is received by the terminal device having the smallest channel capacity in the plurality of terminal devices and that is able to be correctly decoded to obtain the first information bit set, wherein $I(V; Y_2)$ is mutual information between V and $Y_2$.

6. The method according to claim 5, wherein a channel capacity of the terminal device is $I(X; Y)$, wherein X is encoded information associated with the received information sent by the network device, Y is information received by the first terminal device and able to be correctly decoded to obtain the first information bit set, wherein $I(V; Y)$ is mutual information between V and Y, and wherein the first terminal device is any one of the plurality of terminal devices.

7. The method according to claim 3, wherein channel capacities of the plurality of terminal devices comprise two or more different channel capacities.

8. The method according to claim 1, wherein the first information bit set is a set of bits necessary for the information to be used by the communication apparatus, and the second information bit set is a set of bits unnecessary for the information to be used by the communication apparatus.

9. A network device comprising:
at least one non-transitory memory configured to store a computer program; and
at least one processor, wherein when executing the computer program, the at least one processor is configured to:
obtain to-be-encoded first information comprising a first information bit set and a second information bit set,
wherein bits comprising the first information bit set are able to be obtained through a decoding process at each of a plurality of terminal devices, and
wherein bits comprising the second information bit set are able to be obtained through correct a decoding process at less than all of the plurality of terminal devices;
perform first polar encoding on the first information bit set to obtain first encoded information;
perform second polar encoding on the second information bit set based on the first encoded information to obtain second encoded information; and
output the first and second encoded information for transmission to each of the plurality of terminal devices.

10. The apparatus according to claim 9, wherein $K_1$ is a quantity of the bits comprising the first information bit set, and N is a mother code length, wherein $K_1/N$ is equal to or less than $C_1$, and wherein $C_1$ is a capacity of a first constructed channel between the network device and a terminal device among the plurality of terminal devices having a smallest channel capacity among the capacities of the plurality of terminal devices; and
wherein $K_2$ is a quantity of the bits comprising the second information bit set, wherein $K_2/N$ is equal to or less than $C_2$, wherein $C_2$ is a difference between a capacity of a second constructed channel and a capacity of a third constructed channel, wherein the second constructed channel is a channel between the network device and a terminal device among the plurality of terminal devices having a largest channel capacity, and wherein the third constructed channel is a channel between the first and second constructed channels for the first encoded information and the second encoded information, respectively.

11. The apparatus according to claim 9, wherein the first information bit set comprises necessary information in the first information to be used by all of the plurality of terminals, and the second information bit set comprises unnecessary information for use by all of the plurality of terminals.

12. The apparatus according to claim 9, wherein the at least one processor is configured to perform first polar encoding on the first information bit set and a first fixed value bit set to obtain the first encoded information, and wherein the first fixed value bit set is a set of fixed value bits of a terminal device among the plurality of terminal devices having a smallest channel capacity among the plurality of terminal devices.

13. A terminal device comprising:
at least one non-transitory memory configured to store a computer program; and
at least one processor, wherein when executing the computer program, the at least one processor is configured to:

receive information from a network device, wherein the information includes first and second information bit sets;

perform first polar decoding on the received information to obtain the first information bit set;

determine from the first polar decoding of the received information whether the received information includes further information for decoding; and based on determining the received information includes more information for decoding, perform second polar decoding on the received information to obtain a second information bit set.

14. The apparatus according to claim 13, wherein the at least one processor is further configured to:

perform polar encoding on the first information bit set to obtain first encoded information; and perform second polar decoding on the first encoded information and the received information to obtain the second information bit set.

15. The apparatus according to claim 14, wherein the at least one processor is further configured to perform polar encoding on the first information bit set and a first fixed bit set to obtain the first encoded information, wherein the first fixed value bit set is a set of bits of a terminal device having a smallest channel capacity in a plurality of terminal devices, and wherein the plurality of terminal devices are terminal devices that are able to correctly perform decoding to obtain the first information bit set.

16. The apparatus according to claim 15, wherein the at least one processor is further configured to:

determine a capacity of a constructed channel between a network device that broadcasts the first encoded information and the terminal device for receiving the information; and based on determining the capacity being greater than a capacity of a first constructed channel, determine that the received information is able to be decoded for more information, wherein the first constructed channel is a channel between the network device and the terminal device having the smallest channel capacity among channel capacities of the plurality of terminal devices.

17. The apparatus according to claim 16, wherein the at least one processor is further configured to determine $I(V; Y_1)$, wherein V is the first encoded information, $Y_1$ is the received information, and wherein $I(V; Y_1)$ is mutual information between V and $Y_1$; and wherein the capacity of the first constructed channel is $I(V; Y_2)$, wherein $Y_2$ is information received by the terminal device having the smallest channel capacity in the plurality of terminal devices and able to be correctly decoded to obtain the first information bit set, and wherein $I(V; Y_2)$ is mutual information between V and $Y_2$.

18. The apparatus according to claim 17, wherein a channel capacity of a terminal device is $I(X; Y)$, wherein X is encoded information associated with the received information sent by the network device, Y is information received by the first terminal device and able to be correctly decoded to obtain the first information bit set, wherein $I(V; Y)$ is mutual information between V and Y, and wherein the first terminal device is any one of the plurality of terminal devices.

19. The apparatus according to claim 15, wherein channel capacities of the plurality of terminal devices comprise two or more different channel capacities.

20. The apparatus according to claim 13, wherein the first information bit set is a set of bits necessary for the information to be used by the terminal, and wherein the second information bit set is a set of bits unnecessary for the information to be used by the terminal.

* * * * *

UNITED STATES PATENT AND TRADEMARK OFFICE
CERTIFICATE OF CORRECTION

| | | |
|---|---|---|
| PATENT NO. | : 12,119,933 B2 | Page 1 of 1 |
| APPLICATION NO. | : 17/556756 | |
| DATED | : October 15, 2024 | |
| INVENTOR(S) | : Liu et al. | |

It is certified that error appears in the above-identified patent and that said Letters Patent is hereby corrected as shown below:

In the Claims

Claim 9: Column 22, Line 14: "set are able to be obtained through correct a" should read as -- set are able to be obtained through a --.

Signed and Sealed this
Twentieth Day of May, 2025

Coke Morgan Stewart
*Acting Director of the United States Patent and Trademark Office*